United States Patent
Chu et al.

(10) Patent No.: US 6,665,164 B2
(45) Date of Patent: Dec. 16, 2003

(54) SURFACE MOUNTABLE OVER-CURRENT PROTECTING APPARATUS

(75) Inventors: Edward Fu-Hua Chu, Taipei (TW); David Shau-Chew Wang, Taipei (TW); Yun-Ching Ma, Taipei Hsien (TW)

(73) Assignee: Polytronics Technology Corporation, Hsinchu (TW)

( * ) Notice: Subject to any disclaimer, the term of this patent is extended or adjusted under 35 U.S.C. 154(b) by 113 days.

(21) Appl. No.: 10/100,977

(22) Filed: Mar. 19, 2002

(65) Prior Publication Data
US 2002/0135985 A1 Sep. 26, 2002

(30) Foreign Application Priority Data
Mar. 20, 2001 (TW) .................................. 90205460 U

(51) Int. Cl.⁷ ................................................. H02H 5/04
(52) U.S. Cl. ..................................................... 361/106
(58) Field of Search ............................ 361/58, 103, 106

(56) References Cited

U.S. PATENT DOCUMENTS

| | | | | |
|---|---|---|---|---|
| 5,089,801 A | * | 2/1992 | Chan et al. ................ | 338/22 R |
| 5,699,607 A | * | 12/1997 | McGuire et al. ........... | 338/22 R |
| 5,814,791 A | * | 9/1998 | Rudd .......................... | 361/106 |
| 5,818,676 A | * | 10/1998 | Gronowicz .................. | 361/106 |
| 5,831,510 A | * | 11/1998 | Zhang et al. .............. | 338/22 R |
| 5,852,397 A | * | 12/1998 | Chan et al. ................ | 338/22 R |
| 5,864,281 A | * | 1/1999 | Zhang et al. .............. | 338/22 R |
| 5,884,391 A | * | 3/1999 | McGuire et al. ........... | 338/22 R |
| 5,900,800 A | * | 5/1999 | McGuire et al. ........... | 328/22 R |
| 6,023,403 A | * | 2/2000 | McGuire et al. ............ | 361/106 |
| 6,300,859 B1 | * | 10/2001 | Myong et al. .............. | 361/106 |
| 6,377,467 B1 | * | 4/2002 | Chu et al. .................... | 361/767 |

* cited by examiner

*Primary Examiner*—Jeffrey Sterrett
(74) *Attorney, Agent, or Firm*—Seyfarth Shaw LLP

(57) ABSTRACT

The present invention relates to an over-current protecting apparatus, which comprises at least one PTC over-current protecting component and a body. The PTC over-current protecting component has a PTC material, electrodes covering the PTC material, and metal terminations electrically connected to the electrodes. The body has an insulating layer and a first conductive and second conductive regions covering the insulating layer. An end of the first conductive region and second conductive region are electrically connected to the metal terminations, and another ends of the first conductive and second conductive regions are mounted to a PCB. The metal material occupies over 20% area of the sidewall of the first conductive and second conductive regions for increasing solderability. Besides, the top of the PTC over-current protecting component can be adhered to another body to form a symmetrical bodies.

19 Claims, 7 Drawing Sheets

SURFACE MOUNTABLE OVER-CURRENT PROTECTING APPARATUS

BACKGROUND OF THE INVENTION

1. Field of the Invention

The present invention relates to an over-current protecting apparatus, and particularly to an over-current protecting apparatus which can enhance solderability.

2. Description of Related Art

Due to extensive application of portable electronic products such as cellular phones, notebook, hand-carried camera and PDA, it is more and more important for these electronic products to have an over-current or over-temperature protecting functions.

A Positive Temperature Coefficient (PTC) over-current protecting apparatus is often seen in electronic products. Since the PTC over-current protecting apparatus has advantages of reusableness, sensitivity to temperature and stable reliability, it has been extensively used to protect batteries, especially to secondary batteries, such as a nickel-hydrogen battery or a lithium battery.

The PTC over-current protecting apparatus utilizes a PTC material as a current-sensing element, and the resistance of the PTC material is sensitive to temperature variation. In normal operation, the resistance of the PTC material is at a low resistance value to ensure normal circuit operation. When an over-current and over-temperature situation occurs, the resistance of the PTC material will raise immediately over ten thousand times of the initial value to a high impedance state. Thus, the over current is suppressed and limited to a safe level. The purpose of protecting circuit elements and batteries is achieved.

FIG. 1 shows a prior art PTC sheet 10, whose inner structure is disclosed in U.S. patent application. Ser. No. 09/542,283, now U.S. Pat. No. 6,377,467 entitled "Surface mountable over-current protecting device" and filed by the inventors of the present invention. In a cross-sectional view, the PTC sheet 10 has a PTC material 11, an upper electrode 13 and a lower electrode 14 covering the PTC material 11, a first metal termination 15 electrically connected to the upper electrode 13, a second metal termination 16 electrically connected to the lower electrode 14, a solder mask 18 between the first metal termination 15 and the second metal termination 16, and insulating layers for isolating the upper electrode 13 and the second metal termination 16 and isolating the lower electrode 14 and the first metal termination 15. As shown in a top view, the PTC sheet 10 has a plurality of electrically conductive holes 12, and a conductive material is deposited on each electrically conductive hole. In the stage of manufacturing finished products, a dicing saw is used to cut the PTC sheet 10 along the center of the electrically conductive holes 12 (called half-circle manufacturing method). The components after cutting are separated and packaged as shown in FIG. 2.

Due to the trend of minimizing electronic products, a typical dimension of a PTC over-current protecting component is gradually decreased according to the following order: 1812, 1210, 1206, 0805, 0603, 0402; where the first 2 digits and the last 2 digits respectively represent the length and the width of the component in unit of hundredth inch. For example, the form factor 1812 means that the component is 0.18 inches in length and 0.12 inches in width. As the component form factor gets smaller, so does the diameter of the hole. Under the dimension of 0603, the thickness of the dicing saw is getting close to the diameter of the electrically conductive holes 12. Since the hole is so small, there is less room and less tolerance for dicing saw to cut through the hole. Just little off-center cutting could form obvious asymmetry geometry which results in one of the electrically conductive holes of PTC over-current protecting components will have too small surface area on the side wall. Consequently, poor solderability of the PTC over-current protecting component is observed when mounting the PTC over-current protecting component on a PCB. Poor solderability also means poor bonding of PTC component to the PCB. Therefore, any slight vibration or impact will separate the PTC over-current protecting component from the PCB, and causes a reliability problem.

SUMMARY OF THE INVENTION

A main object of the present invention is to propose an over-current protecting apparatus which can raise solderability. By improving solderability, the over-current protecting apparatus of the present invention can be stably adhered to a PCB and the reliability can also be improved.

Another object of the present invention is to propose an over-current protecting apparatus with a simple manufacturing flow. The present apparatus is suitable to a half-circle or full-circle surface mount manufacturing method with no need of increasing footprint on the PCB.

For achieving the above objects and avoiding prior art disadvantages, the present invention proposes an over-current protecting apparatus comprising at least one PTC over-current protecting component and a body. The PTC over-current protecting component has a PTC material, electrodes covering the PTC material and metal terminations electrically connected to the electrodes. The body has an insulating layer and a first conductive and second conductive regions covering the insulating layer. One end of the first conductive and second conductive regions is electrically connected to the metal termination, and another end of the first conductive and second conductive regions is mounted to a PCB. The metal material occupies over 20% area of the sidewall of the first conductive and second conductive regions for increasing solderability. Besides, another body can be adhered to the top of the PTC over-current protecting component to form a symmetrical components.

According to another embodiment of the present invention, the above body is replaced by a known leadframe to obtain the effect of increasing solderability.

BRIEF DESCRIPTION OF THE DRAWINGS

The present invention will be described according to the appended drawings in which.

PREFERRED EMBODIMENT OF THE PRESENT INVENTION

Figures 1, 2:
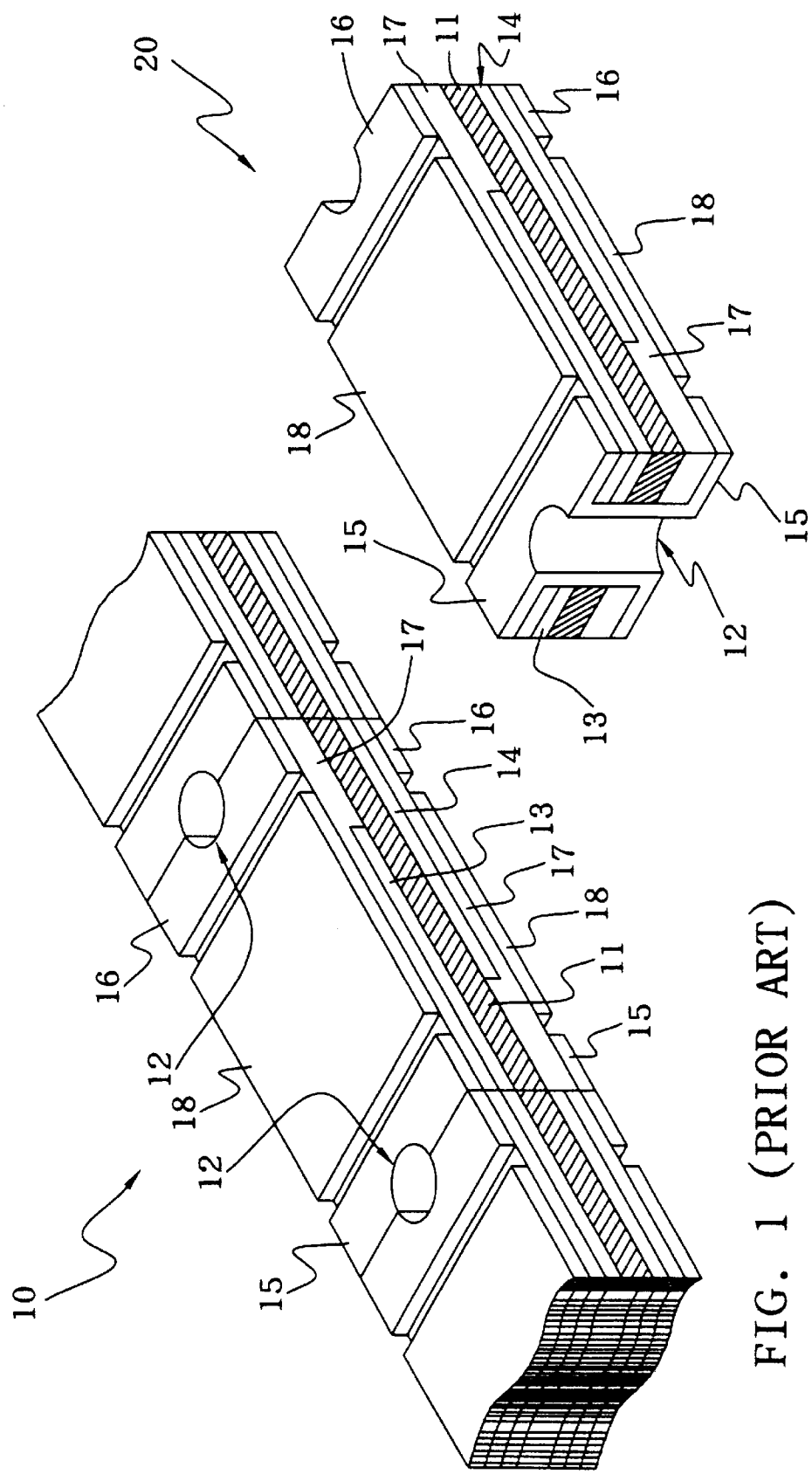
FIG. 1 shows a prior art PTC sheet.
FIG. 2 shows a prior art PTC over-current protecting component.
Figure 3:
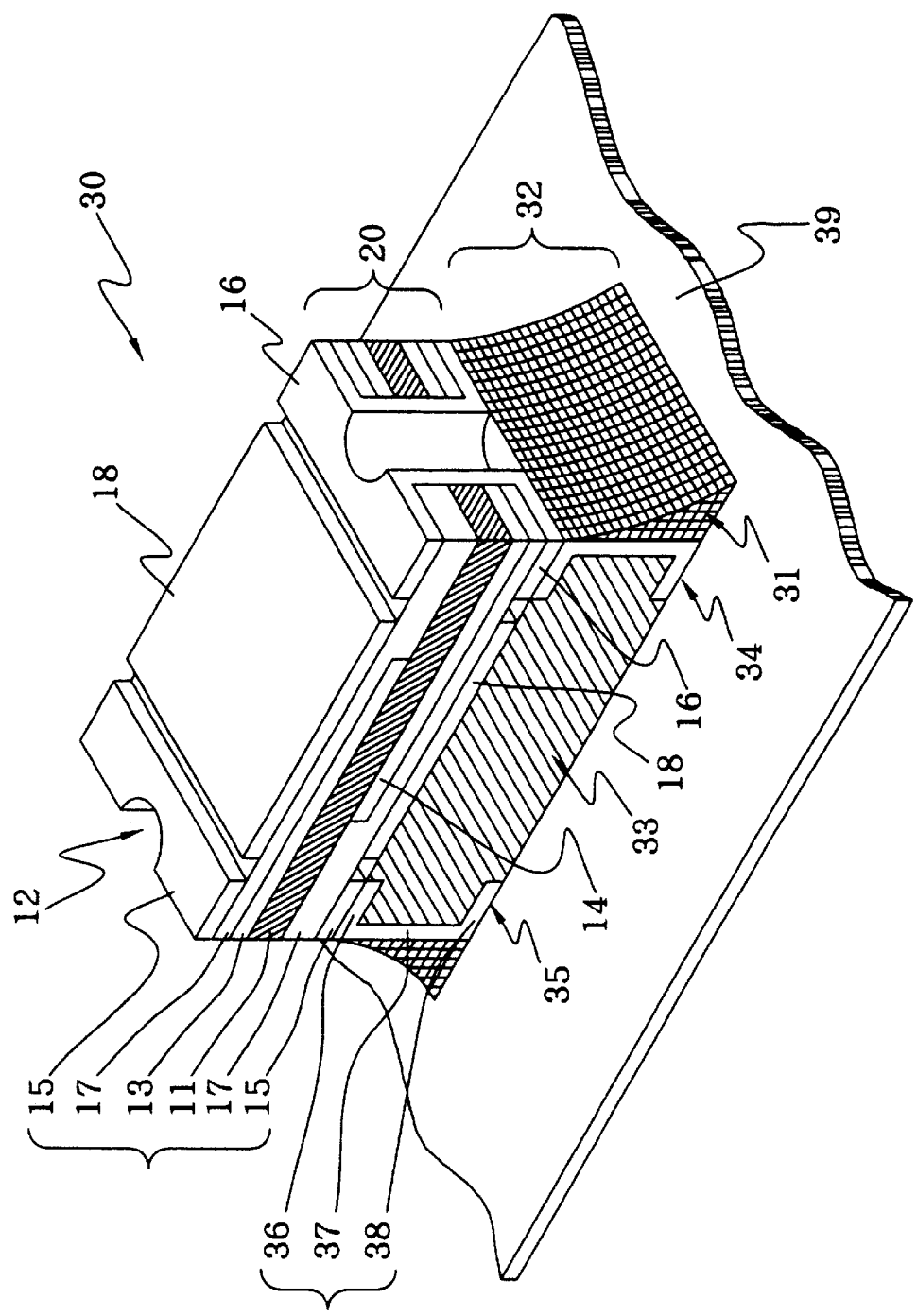
FIG. 3 shows a schematic diagram of an over-current protecting apparatus according to a first embodiment of the present invention.

FIG. 3 shows a schematic diagram of over-current protecting apparatus 30 according to a first embodiment of the present invention. The over-current protecting apparatus 30 comprises a PTC over-current protecting component 20 and a body 32 situated under the PTC over-current protecting component 20. Since the PTC over-current protecting component 20 is vertically disposed on the body 32, the apparatus does not occupy much footprint on the PCB 39 on which the apparatus is mounted. The body 32 includes an insulating layer 33 and a first conductive and second conductive layers 34 and 35 covering both sides of the insulating layer 33. The insulating layer 33 can utilize ceramic material, plastic material or soft board material (such as polyimide), etc., and the present invention has no limitation on that. The first conductive region 34 and the second conductive region 35 each comprise a PTC connecting portion 36, supporting portion 37 and PCB connecting portion 38. The PTC connecting portion 36 can tightly adhere to lower foils of the first metal termination 15 and the second metal termination 16 of the PTC over-current protecting component 20 by way of soldering at a high temperature. The PCB connecting portion 38 is surface mounted to a suitable position of the PCB 39. The supporting portion 37 is used to electrically connected to the PTC connecting portion 36 and PCB connecting portion 38. In FIG. 3, the first conductive region 34 and the second conductive region 35 are configured like a bracket, the configuration is one embodiment of the present invention, and all shapes which could achieve the connection function of the present invention are in the protection scope of the present invention. Besides, the present invention does not limit the internal structure or manufacturing method of the PTC over-current protecting component 20.

One characteristic of the present invention is that the metal material occupies over 20% area of the sidewall of the first conductive region 34 and second conductive region 35, or even a full metal face. Compared to prior art PTC over-current protecting component which has half-circle electrically conductive holes for soldering, the apparatus 30 of the present invention supports more metal area to increase solderability. Due to a siphon phenomenon, the apparatus 30 of the present invention has a better solder climbing effect when mounted to the PCB 39. Depending on the above characteristic, the apparatus 30 will be more stable and reliable than the prior art after soldered to the PCB. In addition, the metal area of the first conductive region 34 and the second conductive region 35 does not limit to a full plane, any shape of the metal area which could raise solderability will be in the scope of the present invention.

A PTC sheet comprising lots of PTC over-current protecting components 20 and a body sheet comprising lots of bodies 32 are aligned and combined by way of soldering at a high temperature. After that, the PTC over-current protecting apparatus comprising a PTC over-current protecting component and a body is cut by a saw. The size of the body 32 is not necessary to equal to that of the PTC over-current protecting component 20, but it is preferable that the size of the body 32 is not less than that of the PTC over-current protecting component 20.

Figure 4:
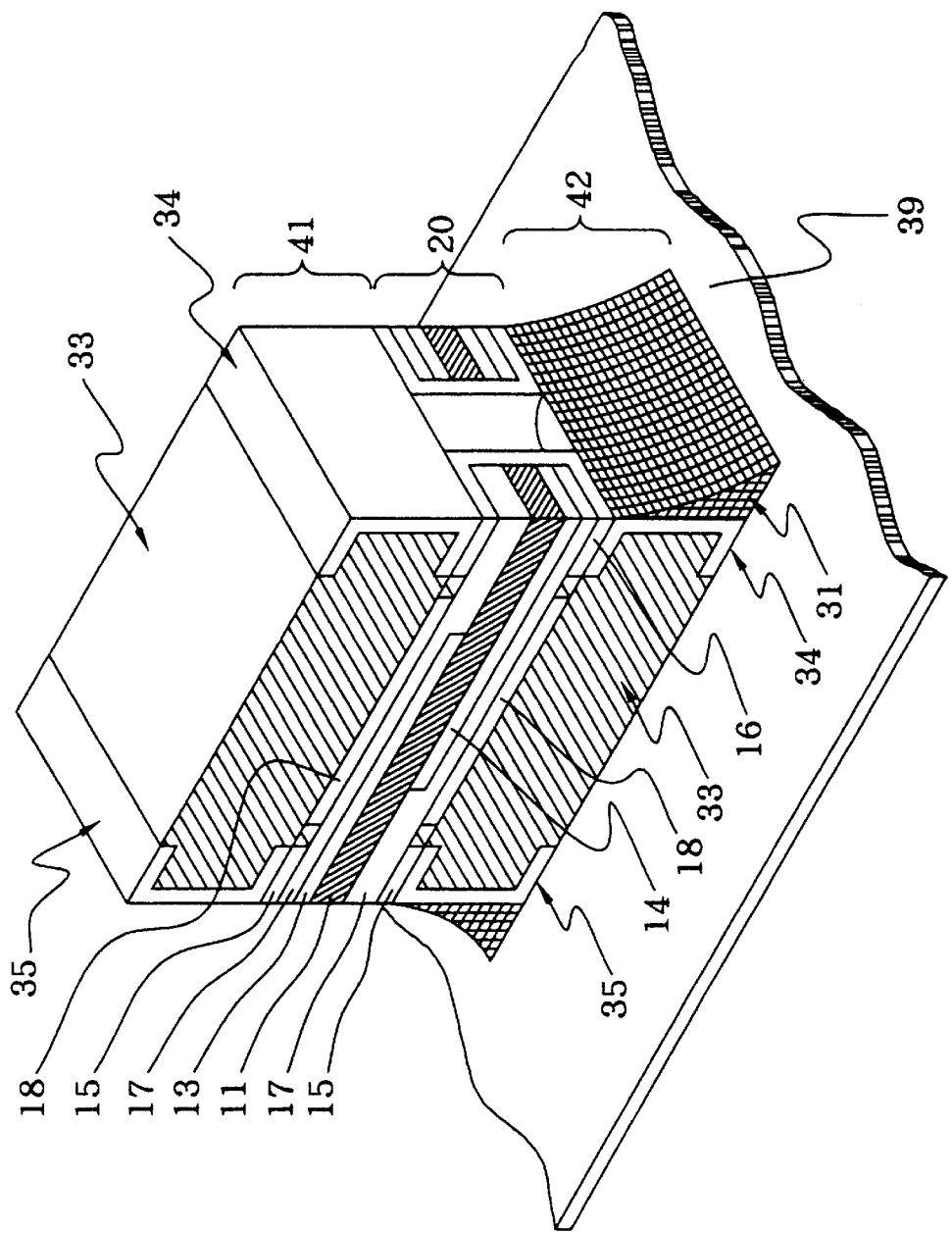
FIG. 4 shows a schematic diagram of an over-current protecting apparatus according to a second embodiment of the present invention.

FIG. 4 shows a schematic diagram of an over-current protecting apparatus according to a second embodiment of the present invention. In this embodiment, a first body 41 is adhered to the top of the PTC over-current protecting component 20, and a second body 42 is adhered to the bottom of the PTC over-current protecting component 20. In addition, a plurality of PTC over-current protecting components can be connected between the first body 41 and the second body 42, and the present invention has no limitation on the structure.

Figure 5:
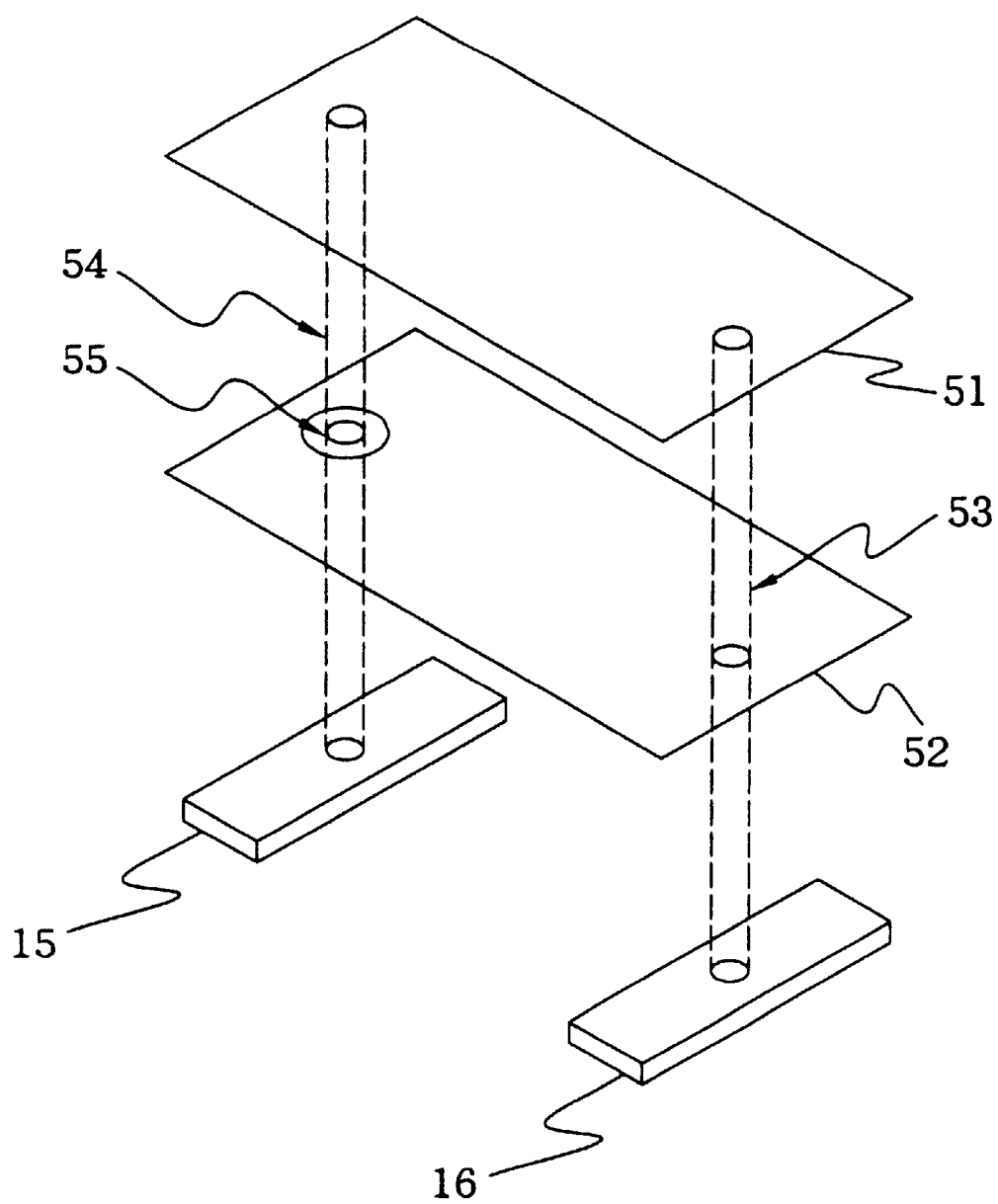
FIG. 5 shows a schematic diagram of electrically conductive holes made by a prior art full-circle manufacturing method.

FIG. 5 shows a schematic diagram of electrically conductive holes made by prior art full-circle manufacturing method. The first conductive layer 51 is electrically connected to a second conductive layer 52 and a second metal termination 16 by a first electrically conductive hole 53. If the first conductive layer 51 is electrically connected to a first metal termination 15 without contacting the second conductive layer 52 by a second electrically conductive hole 54, an etched region 55 is formed at the intersection of the second conductive layer 52 and the second electrically conductive hole 54, to isolate the second conductive layer 52 and the second electrically conductive hole 54.

Figure 6:
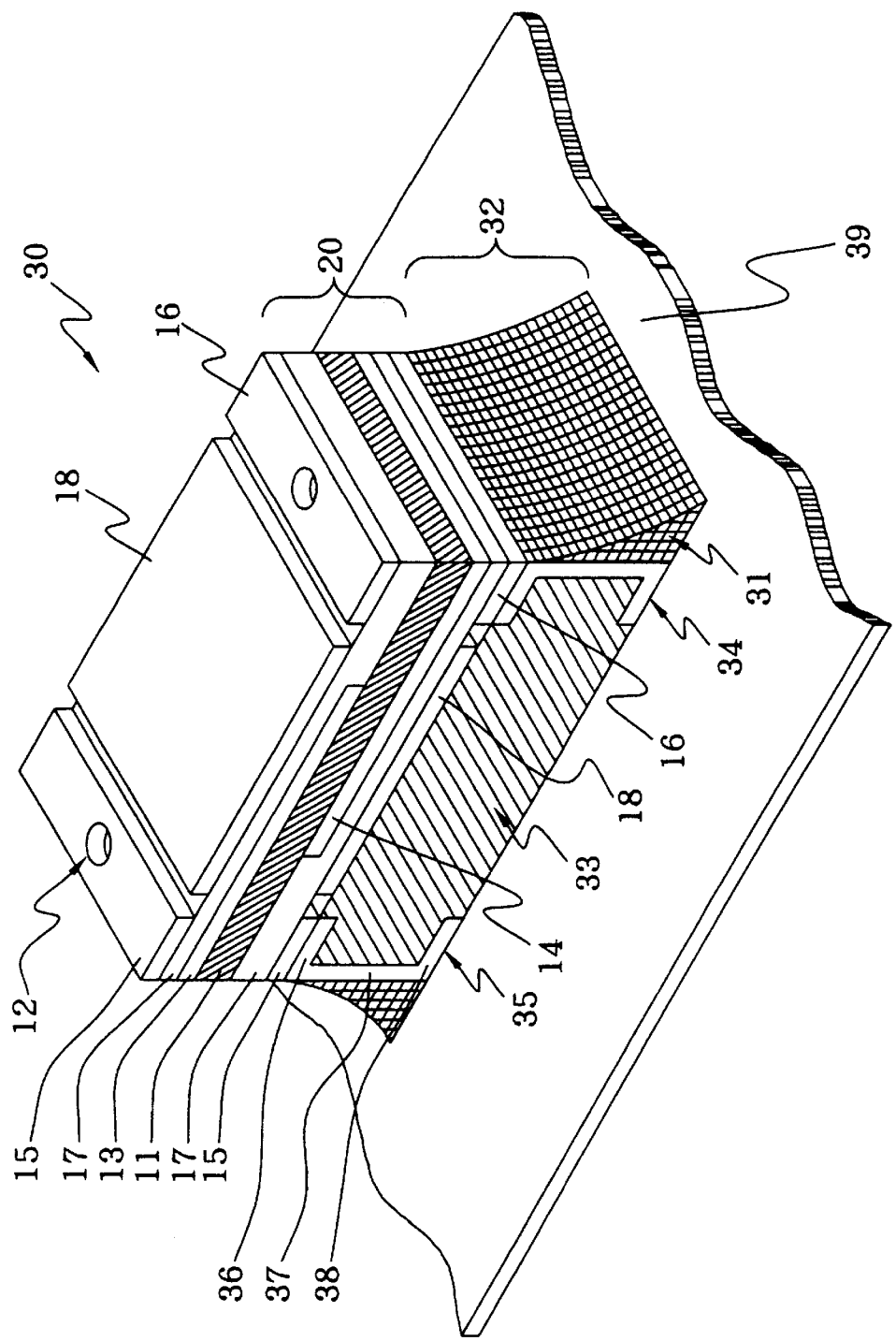
FIG. 6 shows a schematic diagram of an over-current protecting apparatus according to a third embodiment of the present invention.

FIG. 6 shows a schematic diagram of over-current protecting apparatus according to a third embodiment of the present invention. In a full-circle manufacturing method, the cutting line for a saw is not at the center of the electrically conductive hole 12, and the method can avoid reducing the surface area of electrically conductive holes. The prior art full-circle manufacturing method has an obvious disadvantage that the electrically conductive holes exist inside the PTC over-current protecting component, and thus the effect of solderability is not easily predicted. In other words, the prior art has a bad sight inspectable. Since the present invention can combine a PTC over-current protecting component made by a full-circle manufacturing method and a body 32, the problem of bad sight inspectable will be overcome. In other words, the present invention can be used with a PTC over-current protecting component 20 made by either a full-circle or half-circle manufacturing method.

Figure 7A:
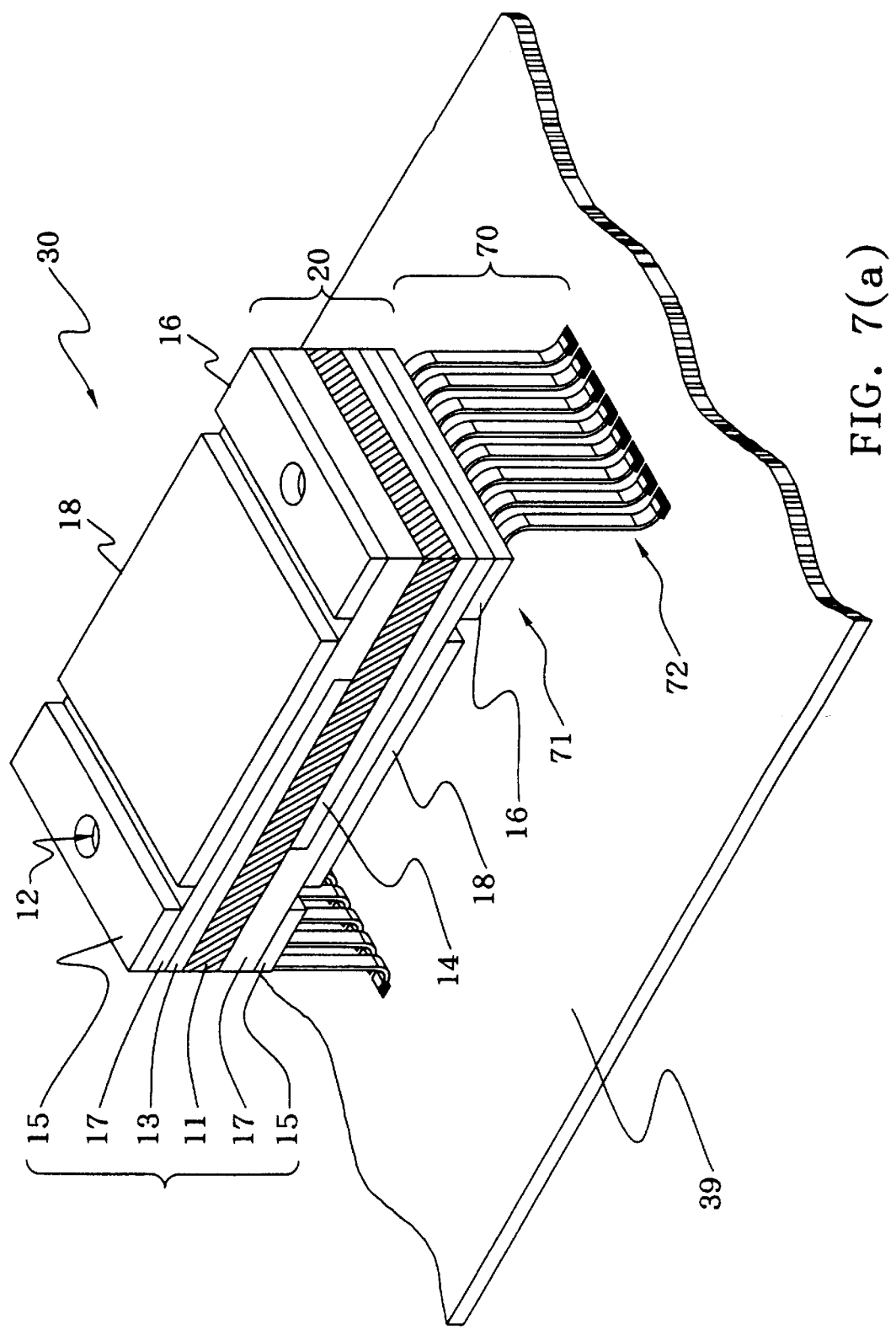
FIGS. 7(a) and 7(b) shows schematic diagrams of an over-current protecting apparatus according to a fourth embodiment of the present invention.
Figure 7B:
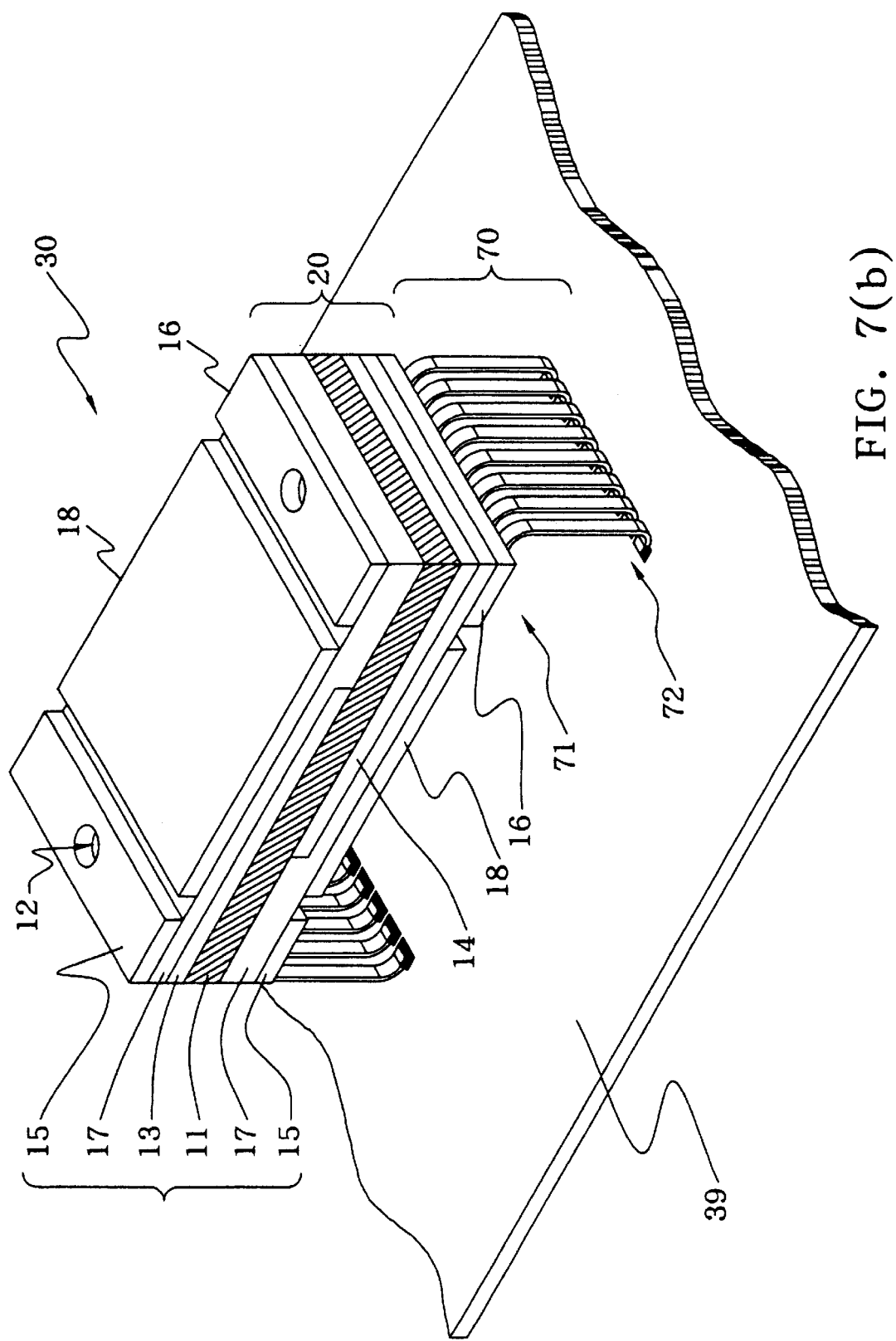

FIGS. 7(a) and 7(b) show schematic diagrams of an over-current protecting apparatus according to a fourth embodiment of the present invention, and the apparatus can use a PTC over-current protecting component made by either a full-circle or half-circle manufacturing method. This embodiment mainly replaces the body 32 of the first to third embodiments by a known SOP or SOJ leadframe 70. Similarly to the first to third embodiments, a substrate 71 of the leadframe 70 is electrically connected to the first metal termination 15 and the second metal termination 16, and leads 72 of the leadframe 70 are electrically connected to the PCB 39. Since the soldering area of this embodiment is larger than that of the prior art PTC over-current protecting component, thus the solderability of the present invention is better than that of the prior art.

The above-described embodiments of the present invention are intended to be illustrated only. Numerous alternative embodiments may be devised by those skilled in the art without departing from the scope of the following claims.

What is claimed is:

1. An over-current protecting apparatus, comprising:
   at least one PTC over-current protecting component having: a PTC material, electrodes covering the PTC material, and metal terminations electrically connected to the electrodes; and
   a body having an insulating layer and a first conductive and second conductive regions covering the insulating layer; an end of the first conductive region and an end of the second conductive region being electrically connected to the metal terminations, and another end of the first conductive region and another end of the second conductive region being mounted to a printed circuit board; a metal material occupying over 20% area of the sidewall of the first conductive and second conductive regions for increasing solderability.

2. The over-current protecting apparatus of claim 1, wherein the PTC over-current protecting component is made by a full-circle manufacturing method.

3. The over-current protecting apparatus of claim 1, wherein the PTC over-current protecting component is made by a half-circle manufacturing method.

4. The over-current protecting apparatus of claim 1, wherein the first conductive and second conductive regions have full metal surfaces.

5. The over-current protecting apparatus of claim 1, wherein the first conductive and second conductive regions each include a PTC connecting portion, a PCB connecting portion and a supporting portion electrically connecting to the PTC connecting portion and PCB connecting portion, the PTC connecting portion is adhered to the metal terminations, and the PCB connecting portion is mounted to the printed circuit board.

6. The over-current protecting apparatus of claim 1, wherein the first conductive and second conductive regions are configured like a bracket.

7. The over-current protecting apparatus of claim 1, wherein the size of the body is not less than the size of the PTC over-current protecting component.

8. An over-current protecting apparatus, comprising:
a first body having an insulating layer, a first conductive and second conductive regions covering the insulating layer;
at least one PTC over-current device having a PTC material, an upper and lower electrodes covering the PTC material, and a first and second metal terminations each having upper and lower foils; wherein the first metal termination is electrically connected to the upper electrode, the second metal termination is electrically connected to the lower electrode; the upper foil of the first conductive termination is electrically connected to the first conductive region of the first body, and the upper foil of the second conductive termination is electrically connected to the second conductive region of the first body; and
a second body having an insulating layer, a first conductive and second conductive regions covering the insulating layer; wherein an end of the first conductive region and an end of the second conductive region are electrically connected to the metal terminations respectively, and another end of the first conductive and second conductive regions are mounted to a printed circuit board; a metal material occupying over 20% area of the sidewall of the first conductive and second conductive regions for increasing solderability.

9. The over-current protecting apparatus of claim 8, wherein the first conductive and second conductive regions have full metal surfaces.

10. The over-current protecting apparatus of claim 8, wherein the PTC over-current protecting component is made by a full-circle manufacturing method.

11. The over-current protecting apparatus of claim 8, wherein the PTC over-current protecting component is made by a half-circle manufacturing method.

12. The over-current protecting apparatus of claim 8, wherein the first conductive and second conductive regions are configured like a bracket.

13. The over-current protecting apparatus of claim 8, wherein the first conductive and second conductive regions of the second body includes a PTC connecting portion, a PCB connecting portion and a supporting portion electrically connected to the PTC connecting portion and PCB connecting portion, the PTC connecting portion is adhered to the metal terminations, and the PCB connecting portion is mounted to the printed circuit board.

14. An over-current protecting apparatus, comprising:
at least one PTC over-current component having a PTC material, electrodes covering the PTC material and metal terminations electrically connected to the electrodes; and
a leadframe having a substrate and a plurality of leads, wherein the substrate is electrically connected to the metal termination, and the plurality of leads are mounted to a printed circuit board on which the over-current protecting component situated.

15. The over-current protecting apparatus of claim 14, wherein the PTC over-current protecting component is made by a full-circle manufacturing method.

16. The over-current protecting apparatus of claim 14, wherein the PTC over-current protecting component is made by a half-circle manufacturing method.

17. The over-current protecting apparatus of claim 14, wherein the leadframe is a SOJ form.

18. The over-current protecting apparatus of claim 14, wherein the leadframe is a SOP form.

19. The over-current protecting apparatus of claim 14, wherein the top of the PTC over-current protecting component is further electrically connected to a leadframe having a substrate and a plurality of leads.

* * * * *